United States Patent [19]

Morich et al.

[11] Patent Number: 5,406,204
[45] Date of Patent: Apr. 11, 1995

[54] INTEGRATED MRI GRADIENT COIL AND RF SCREEN

[75] Inventors: Michael A. Morich, Mentor; Gordon D. DeMeester, Wickliffe; John L. Patrick, Chagrin Falls; Xueming Zou, Chesterland, all of Ohio

[73] Assignee: Picker International, Inc., Highland Hts., Ohio

[21] Appl. No.: 80,413

[22] Filed: Jun. 21, 1993

Related U.S. Application Data

[63] Continuation-in-part of Ser. No. 942,521, Sep. 9, 1992, and a continuation-in-part of Ser. No. 859,152, Mar. 27, 1992, and a continuation-in-part of Ser. No. 859,154, Mar. 27, 1992.

[51] Int. Cl.$^6$ ............................................. G01R 33/20
[52] U.S. Cl. ..................................................... 324/318
[58] Field of Search .............. 335/266; 324/300, 307, 324/309, 310, 311, 312, 313, 314, 318, 319, 320, 322; 128/653.2, 653.5

[56] References Cited

U.S. PATENT DOCUMENTS

| | | | |
|---|---|---|---|
| 4,587,504 | 5/1986 | Brown et al. | 335/216 |
| 4,703,275 | 10/1987 | Holland | 324/318 |
| 4,733,189 | 3/1988 | Punchard et al. | 324/318 |
| 4,737,716 | 4/1988 | Roemer et al. | 324/319 |
| 4,761,612 | 8/1988 | Holland et al. | 324/307 |
| 4,871,969 | 10/1989 | Roemer et al. | 324/318 |
| 4,978,920 | 12/1990 | Mansfield et al. | 324/318 |
| 5,083,085 | 1/1992 | Morad | 324/318 |
| 5,179,338 | 1/1993 | Laskaris et al. | 324/318 |
| 5,278,502 | 1/1994 | Laskaris et al. | 324/318 |
| 5,289,128 | 2/1994 | De Meester et al. | 324/318 |

FOREIGN PATENT DOCUMENTS 2180943 9/1985 United Kingdom .

OTHER PUBLICATIONS

"Active Magnetic Screening of Gradient Coils in NMR Imaging", Mansfield, et al., Journal of Magnetic Resonance, 66, 573–576 (1986).

"Active Magnetic Screening of Coils For Static and Time-Dependent Magnetic Field Generation in NMR Imaging", Mansfield, et al., J. Phys. E. Sci. Instrum. 19, 540–544 (1986).

"Shielded Gradient Coils and Radio Frequency Probes for High-Resolution Imaging of Rat Brains", Jasinski, et al, Magnetic Resonance in Medicine, 24, 29–41 (1992).

"A 60 cm Bore 2.0 Tesla High Homogeneity Magnet For Magnetic Resonance Imaging", Bobrov, et al., IEEE Transactions on Magnetics, vol. MAG-23, No. 2, Mar. 1987.

Primary Examiner—Michael J. Tokar
Attorney, Agent, or Firm—Fay, Sharpe, Beall, Fagan, Minnich & McKee

[57] ABSTRACT

The magnetic field assembly of a magnetic resonance imaging device includes an annular superconducting magnet (10) which is mounted within a toroidal vacuum vessel (24). A cylindrical member (26) defines a central bore through which the superconducting magnets generate a temporally constant primary magnetic field. A cylindrical, dielectric former (46) is mounted in the bore displaced a small distance from the cylindrical member. A radio frequency coil (32) is mounted within the cylindrical member defining a patient receiving examination region. An RF shield (34) is mounted around the exterior peripheral surface of the former. Primary gradient coils (40) are mounted around and potted to the exterior of the dielectric former around the RF shield. Gradient shield or secondary coils (44) are potted around an exterior of the cylindrical member within the vacuum chamber. As illustrated in FIG. 3, when unshielded gradient coils are used, the primary gradient coils and the RF shield are mounted around the outer diameter of the cylindrical member (26).

20 Claims, 3 Drawing Sheets

INTEGRATED MRI GRADIENT COIL AND RF SCREEN

The present application is a continuation-in-part of U.S. applications Ser. Nos. 07/942,521, filed Sep. 9, 1992, 07/859,152, filed Mar. 27, 1992, and 07/859,154, filed Mar. 27, 1992.

BACKGROUND OF THE INVENTION

The present invention relates to the magnetic resonance art. It finds particular application in conjunction with self-shielded gradient and RF coil assemblies for magnetic resonance imaging apparatus and will be described with particular reference thereto. However, it will be appreciated that the present invention will also find application in conjunction with magnetic resonance spectroscopy systems and other applications which require RF fields and gradient magnetic fields.

Heretofore, magnetic resonance imagers have utilized a cylindrical superconducting magnet assembly which generates a temporally constant primary magnetic field axially through a room temperature bore or central cylinder of the magnet assembly. The magnet windings are maintained at liquid helium temperatures in a cryostat. This structure is double walled to provide a vacuum space, intermediate cold shields, and room for superinsulation. Cryostat construction is optimized to minimize helium boil-off. The room temperature bore of the magnet provides space for gradient magnetic field coils, RF coils, and, of course, the object or person to be imaged.

The gradient coils generate axial fields which have gradients in three mutually orthogonal directions, x, y, and the axial direction z. Current waveforms are applied to the gradients during the MR process. The gradients in turn induce eddy currents in the metal structures of the magnet cryostat. The magnetic fields of the eddy currents then become part of the magnetic fields seen by the object being imaged. To the extent that the eddy currents mimic the gradient that caused them, they could be corrected by pre-emphasis. In general, it helps to maintain some spacing between the gradient and magnet structures that might sustain eddy currents. More recently, self shielded gradients have been developed that eliminate the eddy currents in the magnet structure.

Self shielded gradients consist of a primary set of coils on a cylindrical former and a shield set of coils on a second former at a larger radius. At radii outside the shielded gradient, the magnetic fields produced by the primary coils are substantially cancelled by those of the shielding coils. The gradient fields of both sets of coils combine to produce axial directed fields with substantially first order intensity gradients in the x, y, and z-directions. It is desirable that the primary and shield coils have a radius ratio of 1.3 or more so the shield coil does not cancel too much of the field of the primary within the imaging volume. With self shielded gradient coils, the distance from the primary gradient coil to the magnet structures is not critical.

The overall efficiency or power dissipated by the gradient coil is strongly dependent on the spacing between the primary gradient coil and the shield gradient coil. Efficiency is optimized, i.e. power consumption is minimized, when the diameter of the primary gradient field coil is minimized and the diameter of the shield coil is maximized. However, 100 cm. bore magnets in general cost more than smaller, e.g. 90 cm. bore magnets because of materials costs. In order to reduce magnet cost, one would like to reduce the bore diameter consistent with homogeneity requirements. Likewise, in order to improve the gradient efficiency and get more gradient per imposed ampere, one would like to use the maximum space available for the outer coils of a shielded gradient. The maximum diameter of the shield gradient coil assembly is limited by the interior bore of the superconducting magnet or, more commonly, by a shimset of ferrous metal shims mounted within the bore for improving the homogeneity of the main magnetic field.

An RF body coil which is inserted inside the gradient coil generally had an inner diameter of 55-60 cm. RF screens are placed at some radius beyond the RF coil with the specific purpose of generating a known eddy current pattern that is not RF lossy. In addition, there is a degree of isolation between the RF and the gradient coils. For example, the RF screen has been applied to the inner surface of the gradient coil former. The screen is made of overlapping strips of adhesive backed copper about 2-3 inches wide completely covering the surface. The overlap region serves to capacitively couple the strips at 21 to 64 MHz so they look like a reasonably conductive surface. If the adhesive on the copper is RF lossy, it will reduce the Q-factor of the RF coil and thus the signal to noise ratio for NMR. The copper is in strips to reduce the gradient eddy currents generated therein.

One of the important design considerations of the RF screen is the distance between the RF coil conductive elements and the screen. Eddy currents in the screen also generate fields that oppose the fields of the RF coil reducing the overall field. In a sense these "image currents" mimic, in a functional sense, the shield coils of the gradient coil. The screen must produce predictable, reproducible results without RF losses. Beyond the RF screen there is substantially zero RF field.

One disadvantage of the use of adhesive backed copper in the RF coil shield is that it is labor-intensive. Typically, on the order of 32 or more segments are required around the periphery of the inner diameter of the gradient coil bore. A further disadvantage is that the adhesive can be RF lossy and lower the achievable signal-to-noise ratio.

Another method for constructing the RF shield is to use a printed circuit approach with a low-loss substrate.

One disadvantage of the printed circuit board approach is its cost. Substrate materials have been used to obtain the desired low loss characteristics and provide a means for mounting the screen to the gradient inner diameter. This increases processing and fabrication costs as well.

A third and more cost-effective method is to use a fine copper mesh, much like window screen. The broken pattern of the woven mesh is intrinsically worse at conducting low frequency eddy currents than solid copper.

One disadvantage to the use of RF mesh is that mounting the mesh to the interior diameter of the gradient coil is difficult. The screen must be mounted securely with good dimensional control. Generally, an additional substrate is required to support the mesh. This increases the manufacturing costs and consumes valuable space.

Thus, the prior art shielded RF and gradient coils assemblies are thicker in radial dimension. Such thicker RF and gradient coils can be utilized and still maintain the conventional inner diameter of the bore if large diameter, e.g. 100 cm. bore superconducting magnets are utilized. However, the cost of the superconducting magnet varies with its diameter. Accordingly, it is generally considered desirable to reduce the diameter of the inner bore of the magnet, not enlarge it.

Reducing the spacing between the primary and shield gradient coils would reduce efficiency and create significant heating problems. That is, much of the energy consumed by the gradient coil is turned into heat. In an inefficient system in which a large amount of heat is generated, this creates problems in dissipating the heat. Similarly, even a small increase in the relative diameters of the primary RF and shield coils can have a significant change in the amount of energy consumed. For example, a 2% increase in the diameter of the gradient shield coil can result in a 20% decrease in heat energy dissipation.

The present invention provides a new and improved shielded RF and gradient coil design which overcomes the above-referenced problems and others.

SUMMARY OF THE INVENTION

In accordance with one aspect of the present invention, the gradient shield coil is mounted on an outer diameter surface of the bore of the vacuum vessel of the superconducting magnet, i.e. in the superconducting magnet assembly.

In accordance with a more limited aspect of the present invention, a magnetic resonance apparatus is provided. A toroidal superconducting magnet assembly generates a temporally constant magnetic field through an examination region. The superconducting magnet assembly includes a generally cylindrical, dielectric member which defines a longitudinally extending bore which extends around the examination region. A gradient coil means causes magnetic field gradients within the bore. The gradient coil means includes a first gradient coil assembly wrapped around an exterior of the cylindrical member and within the vacuum vessel. A radio frequency coil assembly is disposed within the bore for transmitting radio frequency pulses into the examination region. A sequence control means controls the gradient coil means and the radio frequency coil assembly.

In accordance with a still more limited aspect of the present invention, a second gradient coil assembly is wrapped around an exterior of a cylindrical dielectric former which is disposed within the bore and displaced from the first gradient coil assembly.

In accordance with a yet more limited aspect of the present invention, a radio frequency shield is disposed between at least part of the second gradient coil assembly and the exterior of the former.

In accordance with another aspect of the present invention, the RF screen is mounted as an integral portion of the inner magnetic field gradient coil.

In accordance with a more limited aspect of the present invention, a magnetic resonance apparatus is provided. A superconducting magnet assembly includes a vacuum vessel which has a cylindrical member defining a central bore and a superconducting magnet disposed within the vacuum vessel for generating a primary magnetic field through the bore. A cylindrical dielectric former is disposed within the bore concentric with the cylindrical member. The former has an outer surface which is displaced from an inner surface of the cylindrical member. An RF shield is disposed along the former outer surface. A primary radio frequency coil is disposed within the former.

In accordance with a more specific aspect, a primary gradient coil assembly is mounted to the former outer surface around the radio frequency shield. The gradient coil assembly selectively generates magnetic field gradients within the bore.

One advantage of the present invention is that it improves the efficiency of a self-shielded gradient coil by maximizing the spacing between the primary and shield gradient coils.

Another advantage of the present invention is that is maximizes the gap between the RF body coil and the RF shield. Signal-to-noise is increased and RF transmit power is reduced.

Another advantage of the present invention is that it maximizes the internal usable bore of an MRI magnet while minimizing the inner diameter of the superconducting magnet.

Another advantage of the present invention resides in the simplicity of manufacture.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
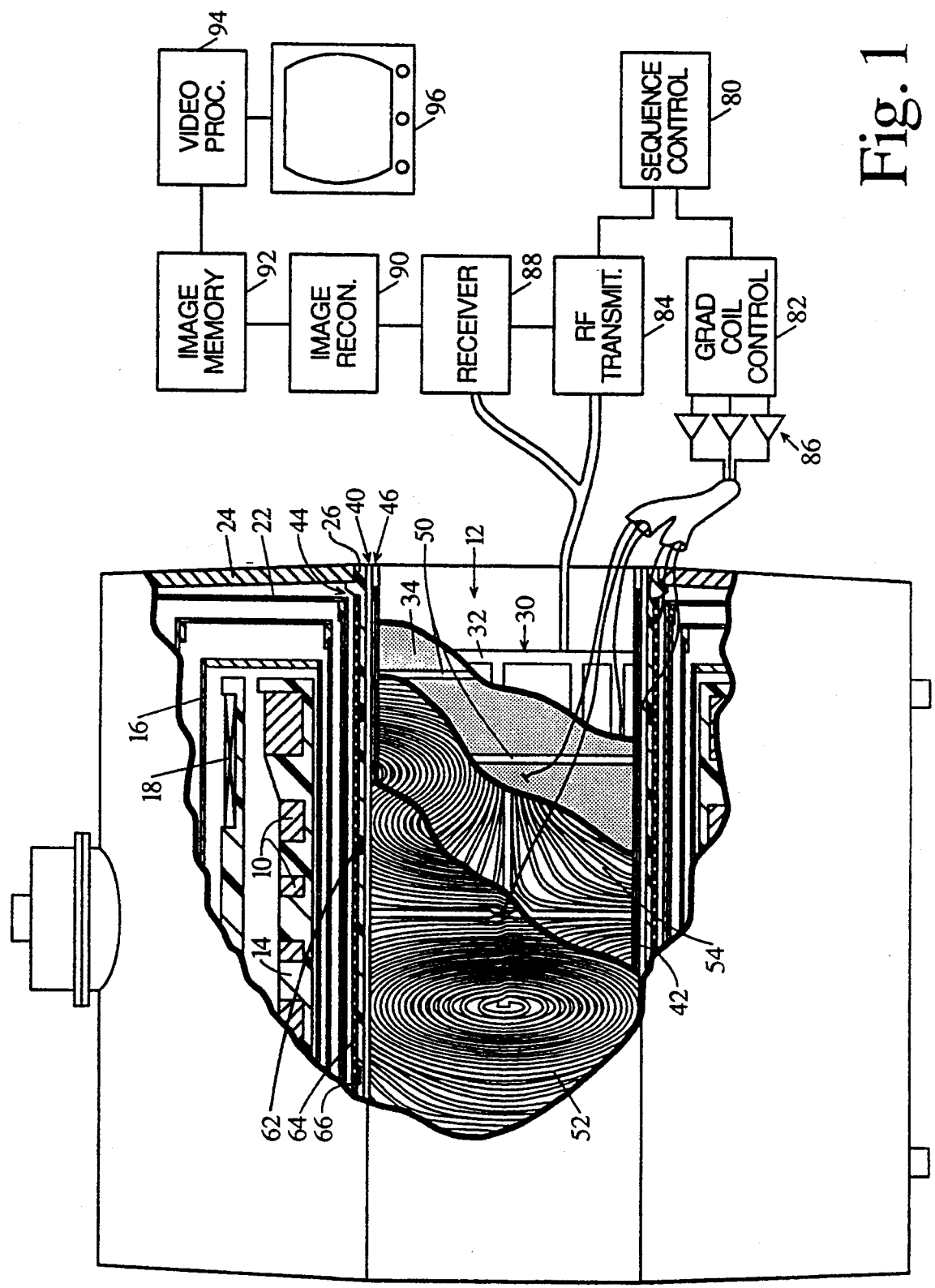
FIG. 1 is a diagrammatic illustration of a magnetic resonance imaging system in accordance with the present invention.

With reference to FIG. 1, a plurality of superconducting magnetic field coils 10 and 18 generate a temporally constant magnetic field. Within an imaging region of a central bore 12, this field is substantially uniform and axial along a longitudinal or z-axis. Additionally, x and y-axes are usually assigned to horizontal and vertical directions to form a mutually orthogonal set. The inner superconducting magnetic field coils 10 of the superconducting magnet are supported by a former 14 which may be a part of a toroidal helium vessel or can 16. The helium vessel is filled with liquid helium to maintain the superconducting magnet coils cold enough to be superconducting with the impressed magnetic field. If required, shield coils 18 can be incorporated to limit the combined magnetic fields of coils 10 and 18 in regions surrounding the superconducting magnet.

To reduce helium boil-off, the toroidal helium vessel 16 is surrounded by a first cold shield 20 which is maintained at about 20° K. A second cold shield assembly 22 is chilled to about 70° K. The first and second cold shields are preferably cooled by mechanical refrigeration (not shown). A toroidal vacuum vessel 24 encases the cold shields to define a vacuum reservoir therearound. The vacuum vessel 24 includes a cylindrical, dielectric member 26 that defines the bore 12 and extends parallel to the z-axis. The main magnetic field is generated through the cylindrical member 26. Preferably, layers of mylar insulation are arranged between the vacuum vessel and the cold shields.

Figure 2:
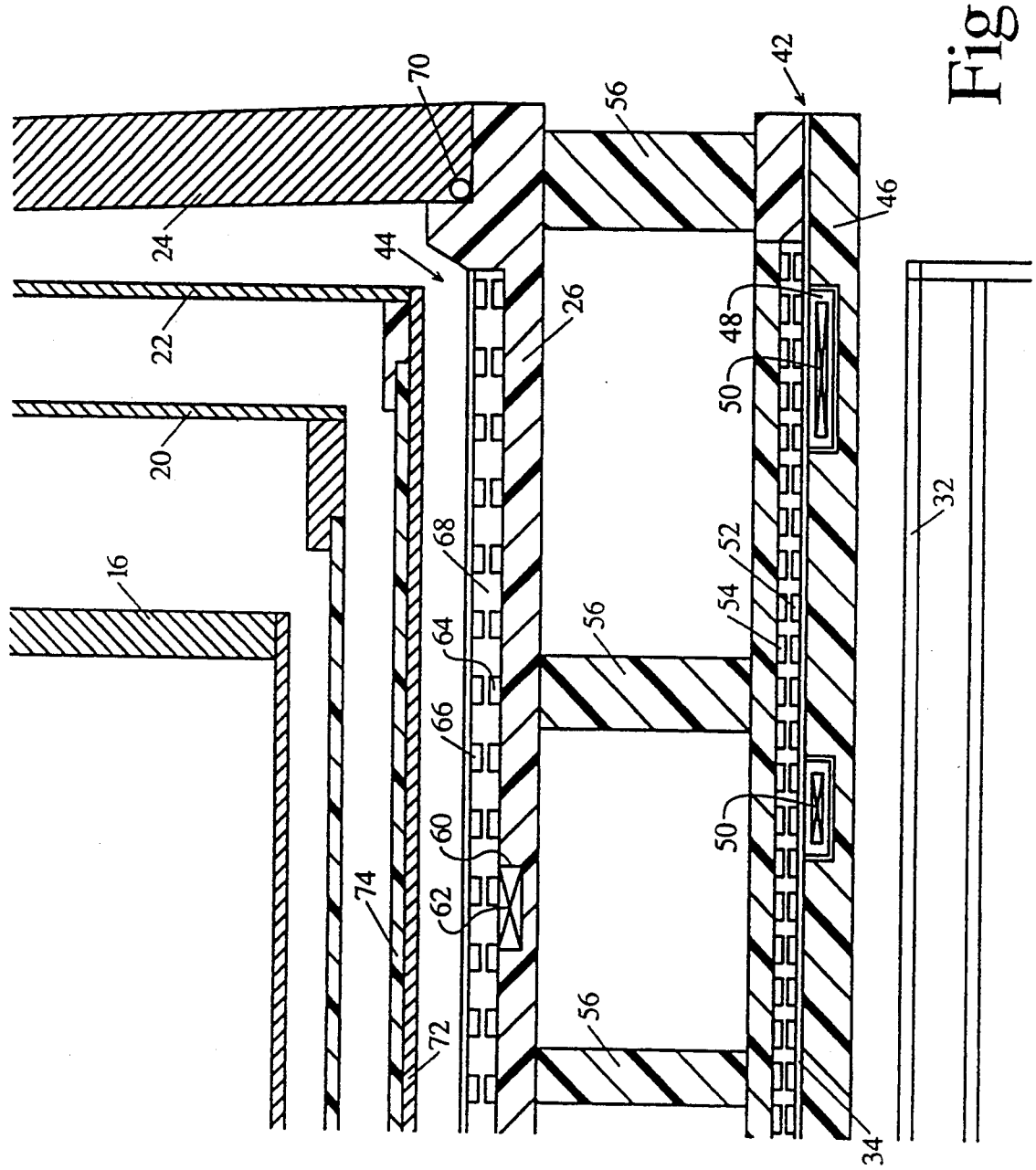
FIG. 2 is an enlarged, detailed cross-sectional view illustrating the relationship of the RF coil and RF shield, the gradient primary and shield coil, and the superconducting magnet vacuum vessel and cold shields.

With continuing reference to FIG. 1 and further reference to FIG. 2, an RF coil assembly 30 is mounted in the bore 12. More specifically, the RF coil assembly includes an RF coil 32 and an RF shield or screen 34. The primary RF coil 32, preferably a quadrature or birdcage type coil, has an inner diameter which defines a patient receiving bore, preferably of at least 55 cm.

A self shielded gradient coil assembly 40 includes a primary whole body gradient coil assembly 42 and a secondary coil assembly 44. The primary gradient coil assembly 42 includes a cylindrical dielectric former 46. Preferably, the former has a sufficient thickness to maintain its structural integrity under the forces associated with generating the magnetic field gradients within the large constant magnetic field of superconducting coils 10 and 18, e.g. 5–10 mm of glass reinforced plastic, preferably about 7.5 mm. The former 46 has a series of grooves 48 defined or cut in its outer surface in accordance with the pattern of a z-gradient coil 50.

The RF shield 34, preferably overlapped and insulated strips of copper foil or a fine copper mesh, is applied to the outer surface of the former 46 and through the z-coil receiving grooves 48. Other RF shields 34 are also contemplated, such as a thin electrically conductive layer that is electro-deposited or sputtered. The RF shield mesh may be deformed into the grooves by tightly wound and insulated z-gradient wire windings, may be fitted into the grooves, may have solder connected or lapped segments extending through the grooves, or the like. The grooves 48 have a depth which generally corresponds to the thickness of the z-gradient coils such that after the z-gradient coils are inserted, a substantially circularly cylindrical surface is presented for receiving x and y-gradient coils 52, 54. If the z-gradient coil is wire wound or otherwise has a construction which does not support significant eddy currents at the RF frequency, the RF shield may be outside of all or part of the z-gradient coil. The x and y-gradient coils 52, 54 are preferably fingerprint type coils as illustrated in greater detail in U.S. patent application Ser. No. 07/942,521. Due to the circular symmetry, the x and y-gradient coils are substantially identical, but offset 90° relative to each other. The x and y-gradient coils, the RF shield, and the z-gradient coils are potted in an epoxy or other dielectric material. The woven screen RF shield and the fingerprint type coils are advantageous in the potting process because they provide paths for the potting material flow.

Various alternate constructions are also contemplated. First, grooves need not be provided for the z-gradient coil. Rather, the z-gradient coil 50 may be laminated in a layer on top of the RF shield 34. It is also contemplated that fingerprint, or alternate, x,y-coils are layered over the RF screen first, and the z-coil built last. Second, if grooves 48 are provided for the z-gradient coil, strips of foil or other RF shield material may be laid in the grooves and a continuous sheet or strips of the RF mesh or other RF shield may be wound over the z-coil. Solder edge connections, capacitive overlap connections, or the like provide electrical continuity between the strips inserted under the z-gradient coil and the remainder of the RF shield. Third, the insulated z-gradient coil may be individual windings, a cluster or bunched coil, or a distributed coil. Fourth, by winding the z-gradient coil under tension, the RF shield screen can be deformed into the grooves.

A plurality of plastic I-beams or other mechanical structures 56 mount the gradient former 46 to the interior surface of the cylindrical member 26 of the superconducting magnet. The I-beams or other mechanical supports 56 define a sufficient gap for receiving main magnet field shims (not shown), typically a multiplicity of ferrous elements, for shimming the uniformity of the primary magnetic field.

The secondary gradient coil 44 includes the cylindrical dielectric member 26 which preferably has grooves 60 for receiving a z-gradient shield coil 62. X and y-gradient shield or secondary coils 64, 66, are mounted on the outer circular periphery of the former 26 and potted in an epoxy potting 68.

The design of the x, y, and z-gradient and gradient shield coils is preferably of the design shown in the above-referenced U.S. patent application Ser. No. 07/942,521. The primary and secondary gradient coils are coupled to create accurate gradient magnetic fields in the bore 12 and cancelling magnetic fields outside the bore, particularly in the vacuum vessel. Preferably, an annulus of more than 33 mm is provided between the primary gradient coil former 46 and the cylindrical member 26. This provides passages for air cooling, displaces the primary and shield gradient coils a maximal amount, and provides a compartment within which to insert magnetic field shims for shimming the uniformity of the main magnetic field. Preferably, the cylindrical member 26 is connected with other portions of the vacuum vessel 24 with an O-ring joint 70 to maintain the vacuum while providing a solid construction which maximizes the space available for cold shield assemblies therein.

Various alternate embodiments are also contemplated. First, the primary z-gradient coil 50 may be a distributed coil defined by copper or other electrically conductive tubes. By running a cooling fluid through the tubes, greater cooling efficiency is achieved and higher power levels or gradient strengths can be run.

Preferably, the cold shield 22 includes a slotted tube cylindrical cold shield portion 72 which is mounted on a cylindrical dielectric former 74.

A sequence control means 80 controls a gradient coil control means 82 and a transmitter 84. The gradient coil control 82 is connected with a series of current pulse generators 86 which, in turn, are connected with the primary gradient coils 50, 52, 54 and the secondary gradient coils 62, 64, 66. The transmitter 84, preferably a digital transmitter, is connected with the primary radio frequency coil for generating pulses of radio frequency signals for exciting and manipulating magnetic resonance in selected dipoles of a portion of a subject within the bore. A radio frequency receiver 88, preferably a digital receiver, is connected with the radio frequency primary coil or surface coils (not shown) for demodulating magnetic resonance signals emanating from the examined portion of the subject. An image reconstruction means 90, such as an inverse two-dimensional Fourier transform reconstruction means, reconstructs the received magnetic resonance signals into an electronic image representation that is stored in an image memory 92. A video processor 94 converts electronic images stored in the memory 92 into appropriate format for display on a video monitor 96.

Figure 3:
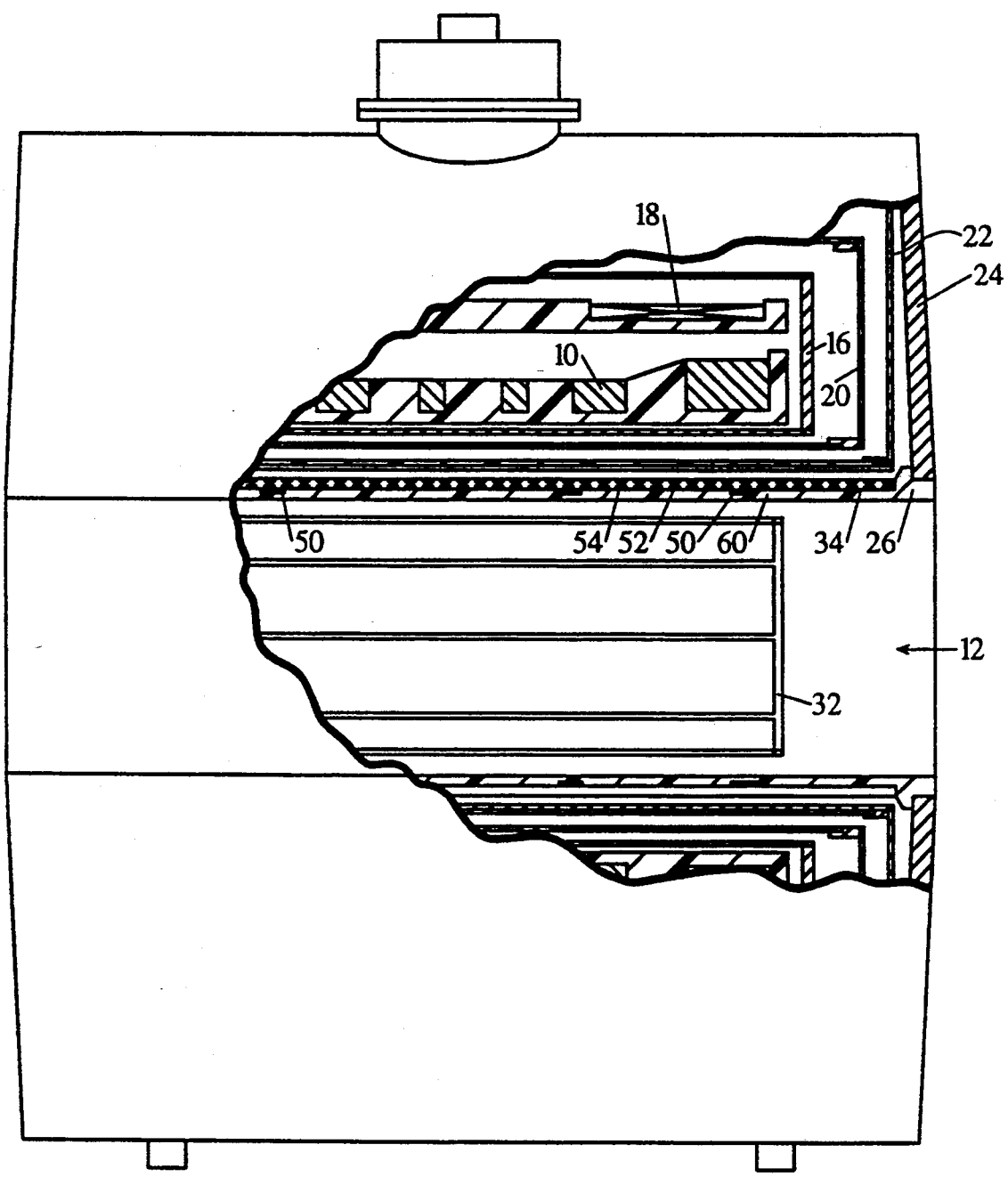
FIG. 3 is an alternate embodiment in which the primary gradient coil assembly is located within the vacuum vessel of a superconducting magnet.

With reference to FIG. 3, the present invention is also applicable to unshielded gradient coils. In the unshielded gradient coil embodiment, the RF shield mesh 34 is wrapped around the outer diameter of the vacuum vessel cylindrical member 26 and has portions inserted into the grooves 60. The primary x, y, and z-gradient coils 50, 54, 56, as described above, are wrapped around the RF shield 32 and potted in epoxy. By mounting the primary x, y, and z-gradient coils in the superconducting magnet assembly, the effective bore of the magnetic resonance imaging apparatus is smaller than the inner diameter of the cylindrical 26 only by the thickness of the RF primary coil assembly 32. The cold shields 20 and 22 and the helium vessel or can 16 are constructed of materials which substantially do not support eddy currents at gradient field frequencies. The helium can is advantageously a dielectric material. The cold shields 20 and 22 may be a thermally conductive but electrically resistive material such as graphite or diamond materials. Alternately, the cold shields may be of a thermally and electrically conductive material, but be constructed of a plurality of sufficiently narrow and thin elements such that low frequency eddy currents are not supported, e.g. a copper or aluminum mesh. As yet another alternative, gradient shield coils could be supported by the cold shield 22 if increased mechanical cooling is provided to compensate for the increased thermal loading.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
 a toroidal superconducting magnet assembly for generating a temporally constant magnetic field through an examination region, the superconducting magnet assembly including a cylindrical member which defines a longitudinally extending bore which extends around the examination region;
 a self-shielded gradient coil assembly including:
  a cylindrical former disposed within the bore displaced from the cylindrical member;
  a primary gradient coil assembly supported by the former;
  a shield gradient coil assembly disposed around and radially displaced from the primary gradient coil assembly;
 a gradient coil control for supplying electrical current to the primary and shield gradient coil assemblies to cause the primary and shield coil assemblies to generate gradient magnetic fields, the primary and shield gradient coil assemblies being configured such that within the former their gradient magnetic fields combine to create selected gradients in the temporally constant magnetic field and in at least selected regions outside of the shield gradient coil assembly, their combined gradient magnetic fields are substantially zero;
 an RF coil assembly disposed within the bore for transmitting radio frequency pulses into the examination region;
 a sequence control connected with the gradient coil control and the RF coil assembly for controlling the creating of the gradients in the temporally constant magnetic field and the transmitting of the radio frequency pulses into the examination region.

2. The magnetic resonance apparatus as set forth in claim 1 wherein the RF coil assembly includes a radio frequency coil disposed within the former and a radio frequency shield disposed between the former and the primary gradient coil assembly.

3. A magnetic resonance imaging apparatus comprising:
 a toroidal superconducting magnet assembly for generating a temporally constant magnetic field through an examination region, the superconducting magnet assembly including a dielectric member which defines a longitudinally extending bore which extends around the examination region;
 a first gradient coil assembly supported by an exterior of the cylindrical member;
 electrical current amplifiers connected with the first gradient coil assembly for supplying electrical current pulses to the first gradient coil assembly to cause gradient pulses in the temporally constant magnetic field;
 an RF coil disposed within the bore;
 a radio frequency transmitter connected with the RF coil for transmitting radio frequency pulses into the examination region;
 a sequence control connected with the electrical current amplifiers and the radio frequency transmitter for selectively controlling causing of the gradient and radio frequency pulses in the examination region.

4. The magnetic resonance apparatus as set forth in claim 3 further including:
 a cylindrical dielectric former disposed within the bore radially displaced from the dielectric member;
 a second gradient coil assembly supported on an exterior of the former and connected with the electrical current amplifiers.

5. The magnetic resonance apparatus as set forth in claim 3 further including a radio frequency shield wrapped around the dielectric member.

6. A magnetic resonance apparatus comprising:
 a superconducting magnet assembly including a vacuum vessel having a cylindrical member defining a central bore and a superconducting magnet disposed within the vacuum vessel for generating a primary magnetic field through the bore;
 a cylindrical dielectric former disposed within the bore concentric with the cylindrical member, the former having an outer surface which is radially displaced from an inner surface of the cylindrical member;
 an RF shield disposed along the former outer surface;
 a radio frequency coil disposed within the former.

7. The magnetic resonance apparatus as set forth in claim 6 further including a self shielded gradient coil assembly having primary gradient coils supported along the former outer surface.

8. The magnetic resonance apparatus as set forth in claim 7 wherein the radio frequency shield includes an electrically conductive mesh sandwiched between the self-shielded gradient coil assembly and the former outer surface.

9. The magnetic resonance apparatus as set forth in claim 6 wherein primary gradient coils are mounted to the former outer surface around the radio frequency shield.

10. The magnetic resonance apparatus as set forth in claim 9 further including a magnetic field gradient shield coil assembly mounted around the cylindrical member within the vacuum vessel for cancelling magnetic field gradients within the vacuum vessel generated by the primary gradient coils.

11. A magnetic resonance imaging apparatus comprising:
   a superconducting magnet assembly for generating a temporally constant magnetic field through an examination region, the superconducting magnet assembly including:
      a toroidal vacuum chamber including a cylindrical, dielectric member which defines a bore therethrough, the bore extending around the examination region,
      an annular superconducting magnet disposed within the toroidal vacuum chamber for generating the temporally constant magnetic field longitudinally through the bore and the examination region,
      a helium vessel disposed within the toroidal vacuum vessel and surrounding the annular superconducting magnet for maintaining the superconducting magnet chilled to a temperature at which it is superconducting;
   first diameter gradient coils supported by an outer surface of the cylindrical, dielectric member within the vacuum vessel;
   a gradient coil control connected with the first diameter gradient coils for causing gradients along first, second, and third mutually orthogonal axes in the temporally constant magnetic field in the bore;
   a radio frequency coil assembly disposed within the bore;
   a radio frequency transmitter for supplying radio frequency signals to the radio frequency coil assembly for transmitting radio frequency pulses into the examination region for inducing and manipulating magnetic resonance of selected dipoles within the examination region;
   a sequence control connected with the gradient coil control and the radio frequency transmitter for generating magnetic resonance imaging gradient and RF pulse sequences;
   an image reconstruction processor for reconstructing image representations from magnetic resonance signals emanating from the examination region.

12. The magnetic resonance imaging apparatus as set forth in claim 11 further including:
   a cylindrical, dielectric former disposed within the bore displaced from the vacuum vessel cylindrical member;
   a plurality of second diameter gradient coils supported by an outer surface of the former for generating magnetic field gradients along the first, second, and third axes, the first and second diameter gradient coils being coupled such that the combined fields create selected magnetic field gradients within the examination region and substantially zero magnetic field gradients in at least selected regions outside of the first diameter gradient coils.

13. The magnetic resonance imaging apparatus as set forth in claim 12 wherein the radio frequency coil assembly includes a primary radio frequency coil disposed within the former and a radio frequency shield disposed substantially along the outer surface of the former.

14. The magnetic resonance imaging apparatus as set forth in claim 13 wherein the former has grooves defined in the outer surface thereof for receiving a portion of the second diameter gradient coils, the RF shield extending through the grooves below the portion of the second diameter gradient coils disposed therein such that the RF shield is disposed between the second diameter gradient coils and the primary RF coil.

15. The magnetic resonance imaging apparatus as set forth in claim 13 wherein the radio frequency shield includes fine metal mesh.

16. The magnetic resonance imaging apparatus as set forth in claim 15 wherein the RF shield and the second diameter gradient coils are potted in epoxy, the RF shield mesh layer defining epoxy flow paths which facilitate potting.

17. The magnetic resonance imaging apparatus as set forth in claim 12 wherein the vacuum vessel cylindrical member defines grooves in an outer surface thereof for receiving at least a portion of the first diameter gradient coil.

18. The magnetic resonance imaging apparatus as set forth in claim 12 further including at least one cold shield disposed between the helium vessel and the toroidal vacuum vessel, the cold shield including a thermally conductive tube surrounding and spaced from the vacuum vessel cylindrical member, the thermally conductive tube being slotted to inhibit the generation of eddy currents therein.

19. The magnetic resonance imaging apparatus as set forth in claim 11 wherein the RF coil assembly includes a radio frequency coil disposed within the vacuum vessel cylindrical member and a radio frequency shield disposed along the outer surface of the vacuum vessel cylindrical member.

20. The magnetic resonance imaging apparatus as set forth in claim 19 wherein the cylindrical member has grooves defined in the outer surface thereof for receiving part of the first diameter gradient coils, the RF shield extending through the grooves below at least a portion of the first diameter gradient coils such that the RF shield is disposed between at least some of the first diameter gradient coils and the radio frequency RF coil.

* * * * *